United States Patent [19]

Stahl et al.

[11] 4,430,154

[45] Feb. 7, 1984

[54] METHOD OF PRODUCING PRINTED CIRCUIT BOARDS

[75] Inventors: Fritz Stahl, Tönisvorst; Horst Steffen, Geldern-Pont, both of Fed. Rep. of Germany

[73] Assignee: Kollmorgen Technologies Corporation, Dallas, Tex.

[21] Appl. No.: 358,226

[22] Filed: Mar. 15, 1982

[30] Foreign Application Priority Data

Mar. 18, 1981 [DE] Fed. Rep. of Germany ....... 3110415

[51] Int. Cl.$^3$ .................... B44C 1/22; C03C 15/00; C03C 25/06; B29C 17/08
[52] U.S. Cl. ..................................... 156/651; 134/28; 134/29; 156/655; 156/659.1; 156/668; 156/902; 252/79.2; 252/79.4; 252/79.5; 427/96
[58] Field of Search ............... 156/629, 630, 633, 634, 156/651, 655, 656, 652, 659.1, 668, 902; 134/3, 28, 29; 427/96, 98, 97; 204/15; 174/68.5; 29/829, 846; 252/79.1, 79.2, 79.4, 79.5

[56] References Cited

U.S. PATENT DOCUMENTS

| | | | |
|---|---|---|---|
| 2,728,693 | 12/1955 | Cado | 427/96 |
| 2,893,150 | 7/1959 | Tann | 427/96 X |
| 3,508,983 | 4/1970 | Origer et al. | 156/902 X |

*Primary Examiner*—William A. Powell
*Attorney, Agent, or Firm*—Morgan, Finnegan, Pine, Foley & Lee

[57] ABSTRACT

The present invention relates to a semi-additive or full-additive process for producing printed circuit or conductor boards having improved electrical resistance in which the coating of adhesive medium exposed between the trains of conductors is removed or partially removed without corroding the base material or copper of the conductor trains by a treatment with an alkaline permanganate or chromic acid solution and suitable washing steps carried out subsequently.

11 Claims, No Drawings

METHOD OF PRODUCING PRINTED CIRCUIT BOARDS

The present invention relates to improved methods of making conductor or printed circuit boards by the full or semi-additive process on insulating base materials which have not been pre-coated with a metal foil, such as, for example, a copper foil, and to printed circuit boards manufactured by such methods.

In the manufacture of printed circuit boards by "full-additive" or semi-additive" processes, metal conductors are formed on an electrical insulated base material such, for example, as phenolic paper laminates, glass fiber-reinforced epoxy laminates and the like. In order to safely secure the metal conductors to the base, for example, by electroless metal deposition processes, it is known to provide the base surface with a coating of an adhesive medium, for example as specified in U.S. Pat. No. 3,625,758, to cure the surface at least partially after such a coating has been applied, and to render the surface subsequently wettable and with a microporous structure by treating it with suitable bath solutions. On the surface so prepared, the desired pattern of conductors is then formed by means of known metal deposition methods.

While the requirements with respect to surface electrical insulation, or resistance, have increased in particular for circuit boards with very small spacings between adjacent conductors, so-called fine conductor boards, known methods of making such circuit boards have the drawback that the electrical insulation values achievable with coatings of adhesive medium fail to reach the surface resistances desired for fine conductor boards such, for example, as can be attained with epoxy laminates or polyamides not coated with adhesive medium.

In the full-additive or semi-additive processes, the insulating material serving as the base is coated in the known way with a phenolic resin/rubber adhesive medium. The coating is cured and the surface made polar and microporous by a treatment with a solution of chromosulfuric acid. The polar, microporous surface of the adhesive coating is treated with catalyst solutions containing known tin/palladium compounds which accumulate adsorbtively on the surface and form catalytically active centers for the currentless deposition of metal. Normally, this is achieved by a treatment of the adsorbed surface with suitable washing baths which remove, on the one hand, the excess catalyst solution while converting the palladium compounds, on the other hand, into nuclei with high catalytic effect. Hydrolysis of the tin compounds occurs during the palladium conversion. The hydrolysis product is also added to the surface.

In the semi-additive process, a relatively thin layer of metal, normally a layer of copper, is subsequently electrolessly deposited from known metallizing baths. A covering mask corresponding with the negative of the desired conductor pattern is applied to the thin layer surface. Copper is then deposited up to the desired thickness on the exposed surface areas which make up the conductor pattern by known, normally galvanic, methods. If desired, other metals such as nickel, gold, or solderable tin/lead alloys may be deposited subsequently. The covering mask is removed after the copper is at the desired thickness and the thin layer of copper theretofore covered by the mask and which had been electroless deposited is removed in an etching step adapted to the requirements in terms of duration. If the circuit board is to be manufactured with conductor patterns on both sides of the board and provided with holes with metallized walls, holes to be metallized are made prior to the catalyzing step. The process is then completed analogous to the steps described above.

It has been discovered that deterioration of the electrical resistance of the surface full-additive and semi-additive circuit board beyond the value associated with the adhesive medium itself is caused by the accumulated catalyst residues in the adhesive surface including the tin compounds not removed even in the copper etching step. Such deterioration is particularly disturbing in cases in which the coatings of adhesive medium have compositions which, per se, exhibit relatively good surface resistances.

Numerous efforts have, heretofore, been made to improve the electrical resistance of such circuit boards by freeing the surface of the adhesive medium of products accumulated thereon during processing by after-treating the surface with cleaning solutions. Such efforts, howeve, have not produced positive results.

Attempts have also been made to dissolve the cured adhesive with organic solvents, such as, methylethyl ketone, or halogenated hydrocarbons. These attempts have failed because, in such a treatment, the base material itself is attacked.

Etching solutions, such as, the chromosulfuric acid used in the preparation of the polar and microporous surface coating of adheisve medium, have also been tried. Such etching solutions, however, remove the copper of the conductors and etch such copper and are unsatisfactory.

In the present invention, the drawbacks described in the foregoing are eliminated by partially or completely removing the adhesive coating present between the conductors after the pattern of such conductors has been completed. This is accomplished by treating the circuit board, after the conductors are formed, and the masked copper has been removed, with an alkaline permanganate solution or solution of chromic acid. Such solutions remove the adhesive coating between the conductors as desired, i.e., either partially or completely, without causing adverse effects.

The permanganate and chromic acid solutions, used in accordance with the invention for removing the adhesive medium, do not adversely affect the base material, the conductors, nor the anchoring of the conductors, but significantly improve the electrical resistance of the surface. Electrical surface resistance, up to the resistance of the base material, might be attained.

EXAMPLE 1

A printed circuit board manufactured in the known way by the semi-additive process on a base material coated with adhesive medium and having a surface resistance of $1.3 \times 10^9$ ohm. was treated for 5 minutes, in accordance with the invention, with an aqueous solution containing 50 g/l $KMnO_4$ and 50 g/l $NaOH$, at a bath temperature of 55° to 60° C., with agitation of the bath by stirring. The board was rinsed in water for 1 minute, followed by 2 minutes rinsing in a 20% solution of hydrochloric acid at room temperature. This acid treatment dissolves manganese compounds formed on the surface. After the acid treatment, the board was washed first in tap water and subsequently in deionized water, and then dried. The surface resistance measured after said treatment was to $5 \times 10^{10}$ ohm. Oxalic acid or hydrozin hydrate might be used in place of the hydrochloric acid to dissolve and remove manganese compounds formed on the surface.

The alkaline permanganate solution is advantageously used, in the instant invention, in those cases in which it is preferred to remove only the layer of adhesive medium contaminated by the catalyzing action. In the treatment with alkaline permanganate solution, the adhesive medium is oxidized by the heptavalent manganese, forming tetravalent manganese firmly anchored on the coating of adhesive medium. The tetravalent manganese prevents progressive corrosion and removal of the coating.

If complete removal is desired, the tetravalent manganese layer must first be removed and the process steps repeated.

If an aqueous solution of chromic acid is used in place of the alkaline permanganate solution, the adhesive medium can be quantitatively removed in the exposed areas, as desired, by adjusting the duration of the treatment with the chromic acid solution.

EXAMPLE 2

The printed circuit board according to Example 1 was treated for 2 minutes with a solution of 900 g $CrO_3$ in $H_2O$ at a bath temperature of 50° C. Subsequently, the board was treated with a solution containing an iron (II)-sulfate reducing agent, washed first in tap water and then in deionized water, and subsquently dried. The treatment completely removed the coating of adhesive medium which, before treatment, had a thickness of about 30μ. The measured surface resistant was $10^{12}$ ohm. Thus, an improvement in electrical resistance of nearly three decimal powers, as compared to the initial condition, was attained. Other reducing agents, such as sodium sulfate, might also be employed in the process.

Printed circuit or conductor boards, which fully satisfy the current and predictable future electrical resistance requirements, can be made by the process of the instant invention.

The present invention is described, by way of the examples above, for printed circuit or conductor boards manufactured by the semi-additive process. However, as is obvious, the process may also be applied in the same way to circuit boards manufactured by other methods, for example, by the full-additive process.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed:

1. In a method for making printed circuit boards by the full- or semi-additive process on an adhesive coated surface of a base material in which the conductors are made first on the adhesive coated surface in the manner known, the improvement comprising the step of removing the adhesive coating on the base material between the conductors without substantially attacking the base material and the conductors thereon by treating said printed circuit board with said adhesive coated surface and said conductors thereon with a solution selected from the group consisting of an alkaline permanganate and a chromic acid and thereafter washing said treated board.

2. In a method, as defined in claim 1, in which said adhesive coating is removed with an alkaline permanganate solution.

3. In a method, as defined in claim 1, in which said adhesive coating is removed with a chromic acid solution.

4. In a method, as defined in claim 2, in which said base material having conductors thereon is first treated with an alkaline permanganate solution, the residues of manganese compound are subsequently completely removed from the surface and said surface is subsequently washed.

5. In a method, as defined in claim 1, in which said base material having conductors thereon is treated
   (a) for 5 minutes at 55° to 60° C. in an aqueous solution containing 50 g/l $KMnO_4$ and 50 g/l NaOH,
   (b) thereafter rinsed with water for 2 minutes with a 20% solution of hydrochloric acid, and
   (c) subsequently washed first in tap water and then in deionized water and subsequently dried.

6. In a method, as defined in claim 5, in which the rinse in step (b), is with a solution containing oxalic acid, hydrazin hydrate or compound for removing manganise compounds.

7. In a method, as defined in claim 4, in which the steps for removing the coating of adhesive medium are repeated until removal is achieved to the desired extent or said coating of adhesive medium has been completely removed.

8. In a method, as defined in claim 3, in which the base material provided with conductors is first treated with an aqueous chromic acid solution; that reaction residues such as hexavalent chromium compounds are removed, and that said steps are followed by a washing and drying step.

9. In a method, as defined in claim 8, in which a solution containing a reduction agent for hexavalent chromium is used for removing the reaction residues.

10. In a method, as defined in claim 9, in which the reduction agent contains iron(II)-sulfate or sodium sulfite or formaldehyde.

11. In a method, as defined in any one of claims 8, 9 or 10, in which the base material provided with conductors is
    (a) treated for 2 minutes with a solution of 900 g $CrO_3$ in water at a bath temperature of 50° C.,
    (b) subsequently washed in water, and after a treatment with a solution of iron(II)-sulfate or sodium sulfite or formaldehyde,
    (c) then rinsed first in tap water and then in deionized water and then dried.

* * * * *